United States Patent
Wu et al.

(10) Patent No.: US 9,601,594 B2
(45) Date of Patent: Mar. 21, 2017

(54) SEMICONDUCTOR DEVICE WITH ENHANCED STRAIN

(75) Inventors: Cheng-Hsien Wu, Hsinchu (TW); Chih-Hsin Ko, Fongshan (TW); Clement Hsingjen Wann, Carmel, NY (US)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 141 days.

(21) Appl. No.: 13/295,178

(22) Filed: Nov. 14, 2011

(65) Prior Publication Data

US 2013/0119405 A1    May 16, 2013

(51) Int. Cl.
| | |
|---|---|
| *H01L 21/70* | (2006.01) |
| *H01L 21/76* | (2006.01) |
| *H01L 29/66* | (2006.01) |
| *H01L 29/78* | (2006.01) |
| *H01L 29/08* | (2006.01) |
| *H01L 21/762* | (2006.01) |

(52) U.S. Cl.
CPC .. *H01L 29/66575* (2013.01); *H01L 21/76224* (2013.01); *H01L 29/0847* (2013.01); *H01L 29/66636* (2013.01); *H01L 29/7834* (2013.01); *H01L 29/7848* (2013.01)

(58) Field of Classification Search
CPC ......... H01L 21/76224; H01L 21/76232; H01L 21/76286; H01L 21/823878; H01L 29/7846; H01L 29/66575; H01L 29/66636; H01L 29/7848; H01L 29/0847; H01L 29/7834

USPC ....... 438/222, 196, 207, 218, 248, 294, 429, 438/430; 257/374
See application file for complete search history.

(56) References Cited

U.S. PATENT DOCUMENTS

| | | | | |
|---|---|---|---|---|
| 5,677,231 | A  * | 10/1997 | Maniar et al. | ................. 438/221 |
| 6,713,780 | B2 * | 3/2004  | Lam | .................. H01L 21/76224 |
| | | | | 257/552 |
| 7,678,630 | B2 * | 3/2010  | Lindsay | ........................ 438/197 |
| 7,816,766 | B2 * | 10/2010 | Tamura et al. | ................ 257/616 |
| 8,017,472 | B2 * | 9/2011  | Han et al. | ...................... 438/222 |
| 8,975,697 | B2 * | 3/2015  | Cheng et al. | .................. 257/347 |
| 2002/0053715 | A1* | 5/2002 | Kim et al. | ..................... 257/524 |
| 2003/0071321 | A1* | 4/2003 | Hong | ............................. 257/499 |
| 2005/0032340 | A1* | 2/2005 | Takizawa | ...................... 438/489 |
| 2005/0136618 | A1* | 6/2005 | Lee et al. | ..................... 438/435 |
| 2005/0205859 | A1* | 9/2005 | Currie et al. | ................... 257/19 |

(Continued)

FOREIGN PATENT DOCUMENTS

CN    101312191    11/2008

*Primary Examiner* — Latanya N Crawford
(74) *Attorney, Agent, or Firm* — Haynes and Boone, LLP

(57) ABSTRACT

The present disclosure provides a semiconductor device. The semiconductor device includes a semiconductor substrate. The semiconductor device includes a gate that is disposed over the substrate. The substrate has a recess. The semiconductor device includes a trench liner that is coated along the recess. The trench liner contains a semiconductor crystal material. The trench liner directly abuts the source/drain stressor device. The semiconductor device also includes a dielectric trench component that is disposed on the trench liner and filling the recess. The semiconductor device includes a source/drain stressor device that is disposed in the substrate. The source/drain stressor device is disposed between the gate and the trench liner.

20 Claims, 8 Drawing Sheets

(56) References Cited

U.S. PATENT DOCUMENTS

| | | | |
|---|---|---|---|
| 2007/0059875 A1* | 3/2007 | Mishima | H01L 21/268 |
| | | | 438/199 |
| 2007/0069307 A1* | 3/2007 | Eda | 257/374 |
| 2008/0150037 A1* | 6/2008 | Teo et al. | 257/374 |
| 2008/0157200 A1* | 7/2008 | Kim | H01L 29/66628 |
| | | | 257/347 |
| 2008/0290420 A1* | 11/2008 | Yu et al. | 257/374 |
| 2012/0049294 A1* | 3/2012 | Chen et al. | 257/401 |
| 2012/0187523 A1* | 7/2012 | Cummings et al. | 257/506 |
| 2013/0015526 A1* | 1/2013 | Liang et al. | 257/351 |

* cited by examiner

SEMICONDUCTOR DEVICE WITH ENHANCED STRAIN

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

A transistor device may be strained—for example through application of a stress—to improve carrier mobility in its conductive channel. The stress may be provided by source/drain stressors formed adjacent to the channel. However, depending on the location of the source/drain stressor relative to a free boundary (e.g., shallow trench isolation), the stress provided by the source/drain stressor may be substantially reduced, thereby degrading carrier mobility. Conventional strained transistor devices have not provided a good solution to this problem. Therefore, while existing strained transistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
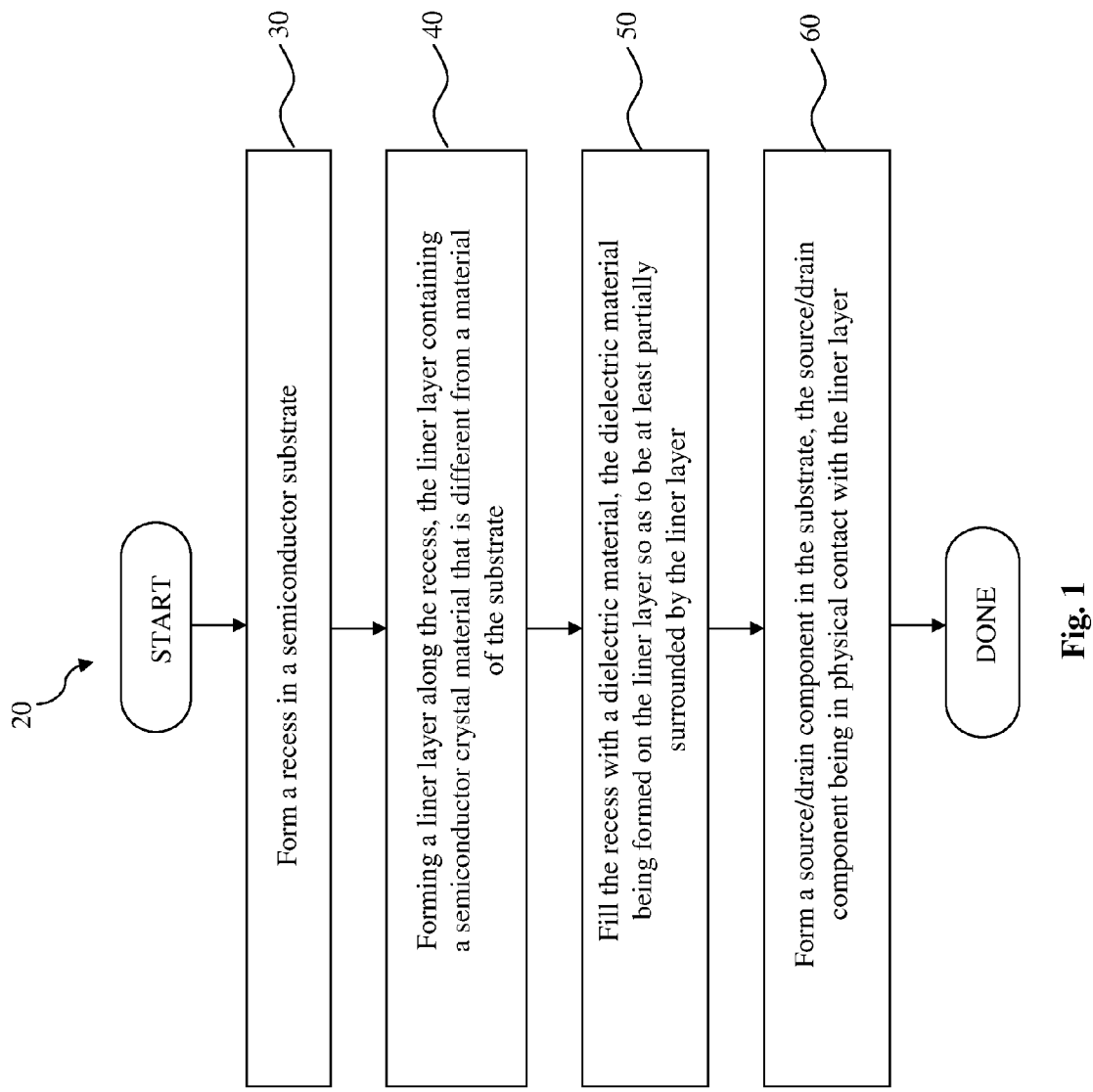
FIG. 1 is a flowchart illustrating a method of fabricating a semiconductor device according to various aspects of the present disclosure.

Illustrated in FIG. 1 is a flowchart of a method 20 for fabricating a strained semiconductor device according to various aspects of the present disclosure. The method 20 includes a block 30, in which a recess is formed in a semiconductor substrate. The method 20 includes a block 40, in which a liner layer is formed along the recess. The liner layer contains a semiconductor crystal material that is different from a material of the substrate. In some embodiments, the liner layer includes a material selected from the group consisting of: a III-V group compound, and a II-VI group compound. The method 20 includes a block 50, in which the recess is filled with a dielectric material. The dielectric material is formed on the liner layer so as to be at least partially surrounded by the liner layer.

The method 20 includes a block 60, in which a source/drain component is formed in the substrate. The source/drain component is in physical contact with the liner layer. The physical contact between the liner layer and the source/drain component causes stress to the source/drain component. In some embodiments, the block 60 includes forming an opening in the substrate and epi-growing one of: a silicon germanium material and a silicon carbide material in the opening. The opening may be formed by performing one or more etching processes to the substrate in a manner such that the liner layer is substantially free of being etched during the one or more etching processes. It is understood that additional processes may be provided before, during, and after the method 20 of FIG. 1, and that some other processes may only be briefly described herein.

FIGS. 2 to 8 are diagrammatic fragmentary cross-sectional side views of a portion of a semiconductor device 100 at various fabrication stages according to embodiments of the method 20 of FIG. 1. The semiconductor device 100 may be an integrated circuit, or portion thereof, that may comprise memory circuits and/or logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 100 may be fabricated with a CMOS process flow. FIGS. 2 to 8 have been simplified for a better understanding of the inventive concepts of the present disclosure.

Figure 2:
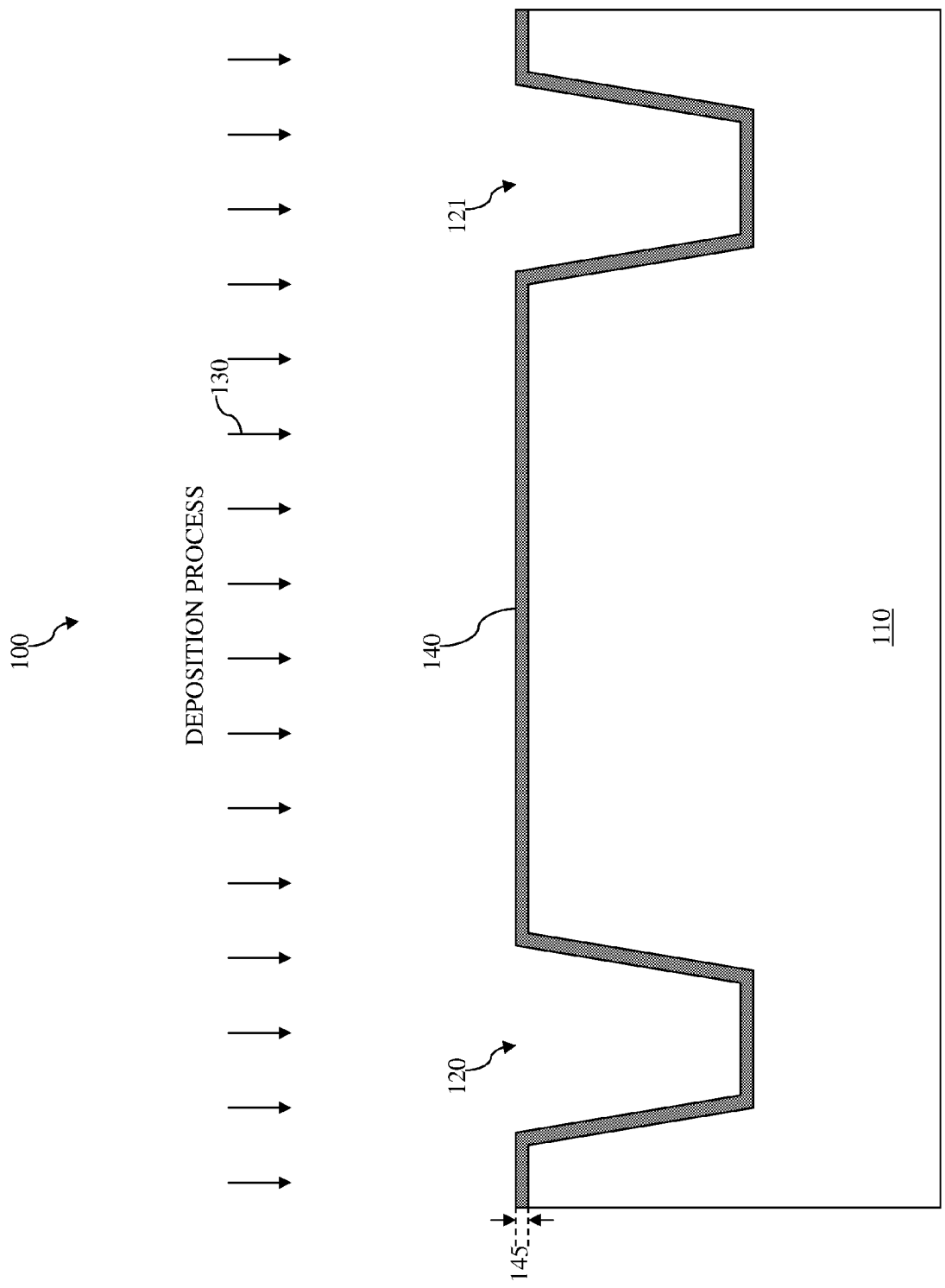
FIGS. 2-8 are simplified cross sectional views of a semiconductor device at various stages of fabrication according to various aspects of the present disclosure.

Referring now to FIG. 2, the semiconductor device 100 includes a substrate 110. The substrate 110 may have various doping configurations depending on design requirements known in the art. In the illustrated embodiments, the substrate 110 includes a crystal silicon material. Alternatively, the substrate 110 may also include other elementary semiconductors such as germanium and diamond. Furthermore, in some embodiments, the substrate 110 may include a compound semiconductor and/or an alloy semiconductor. It is also understood that the cross-sectional Figures herein illustrate only a portion of the substrate 110 for the sake of simplicity, and that the substrate 110 may contain additional features that are not shown herein.

A plurality of openings (or recesses/trenches) are formed in the substrate 110, two of which are illustrated in FIG. 2 as openings 120-121. The openings 120-121 may be formed by an etching process known in the art, for example a dry etching process. After the openings 120-121 are formed, a deposition process 130 is performed. In some embodiments, the deposition process 130 includes a Metal-Organic Chemical Vapour Deposition (MOCVD) process. In other embodiments, alternative deposition processes may be used to carry out the deposition process 130, such as Chemical Vapor Deposition (CVD), Physical Vapor Deposition (PVD), Atomic Layer Deposition (ALD), or combinations thereof.

The deposition process 130 forms a liner layer 140 over the exposed surface of the substrate 110. The liner layer 140 contains a semiconductor crystal material. The semiconductor crystal material is different from the material of the substrate 110. For example, in embodiments where the substrate 110 contains silicon, the liner layer 140 may contain a compound from a III-V family (or group) of the periodic table. The III-V group compound includes an element from a "III" group of the periodic table, and another element from a "V" group of the periodic table. For example, the III family elements may include Boron, Aluminum, Gallium, Indium, and Titanium, and the V family elements may include Nitrogen, Phosphorous, Arsenic, Antimony, and Bismuth. In alternative embodiments, the liner layer 140 may contain a compound from a II-VI family (or group) of the periodic table.

As shown in FIG. 2, the liner layer 140 partially fills the openings 120-121. In other words, the liner layer 140 is coated along the sidewalls and the bottom surface of the openings 120-121. The liner layer 140 has a thickness 145. In some embodiments, the thickness 150 is in a range from about 1 nanometer to about 3 nanometers.

Figure 3:
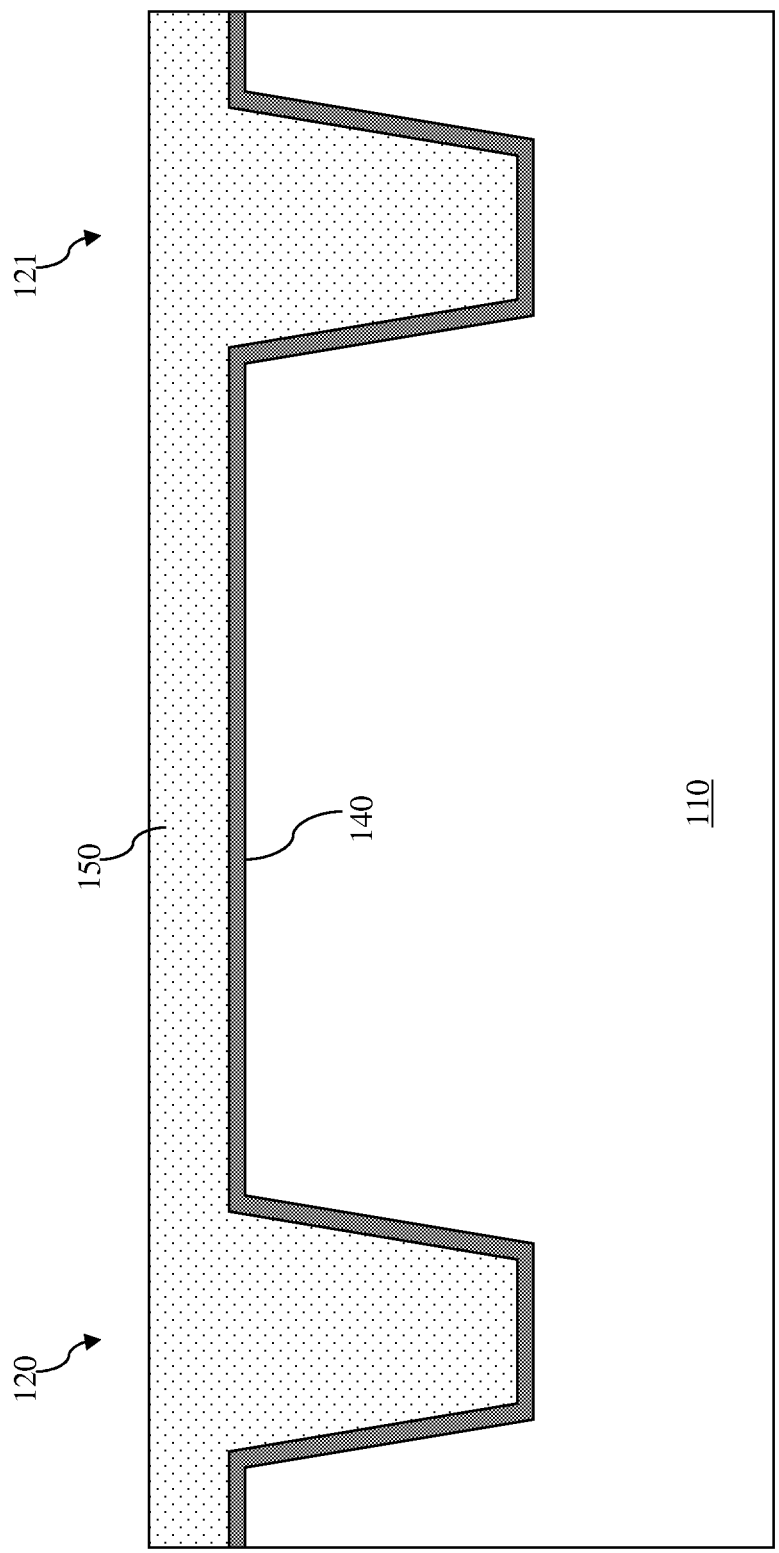

Referring now to FIG. 3, a dielectric material 150 is formed over the substrate and on the liner layer 140. The dielectric material 150 completely fills the openings 120-121. In an embodiment, the dielectric material 150 contains silicon oxide. In other embodiments, the dielectric material may include silicon nitride, silicon oxynitride, fluoride-doped silicate (FSG), and/or a low-k dielectric material known in the art.

Figure 4:
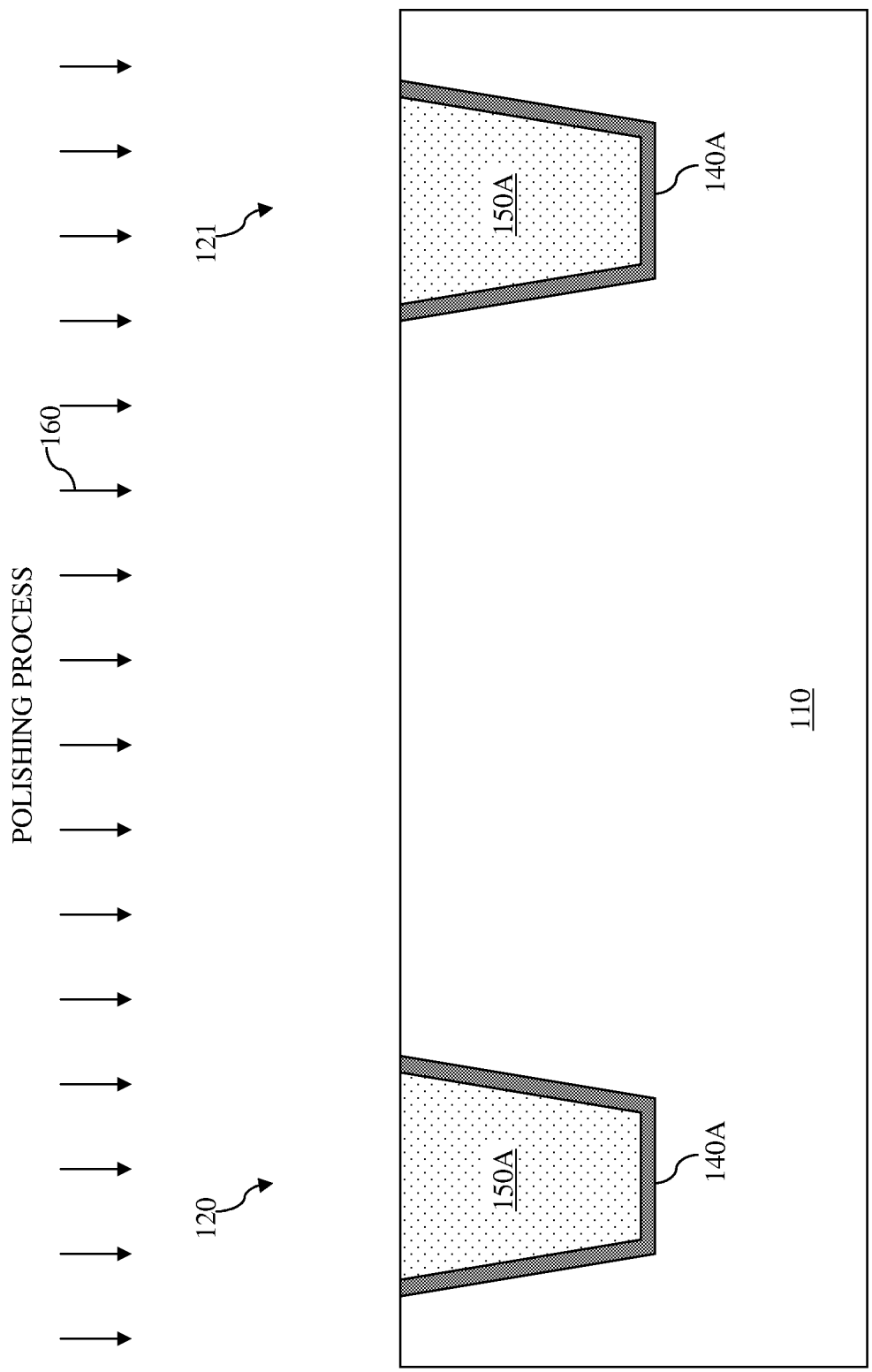

Referring now to FIG. 4, a polishing process 160 is performed to remove portions of the dielectric material 150 and portions of the liner layer 140 outside the openings 120-121. In some embodiments, the polishing process 160 includes a chemical-mechanical-polishing (CMP) process. The CMP process grinds away the dielectric material 150 and the liner layer 140 until the remaining portions of the dielectric material 150 and the liner layer 140 filling the openings 120-121 are substantially co-planar with the surface of the substrate 110. At this stage of fabrication, the portions of the dielectric layer 150 filling the openings 120-121 form shallow trench isolation (STI) devices 150A. The STI devices 150A are at least partially surrounded (or wrapped around) by the liner layers 140A remaining in the openings 120-121. Stated differently, the STI devices 150A are insulated or isolated from the substrate 110 by the liner layers 140A.

Figure 5:
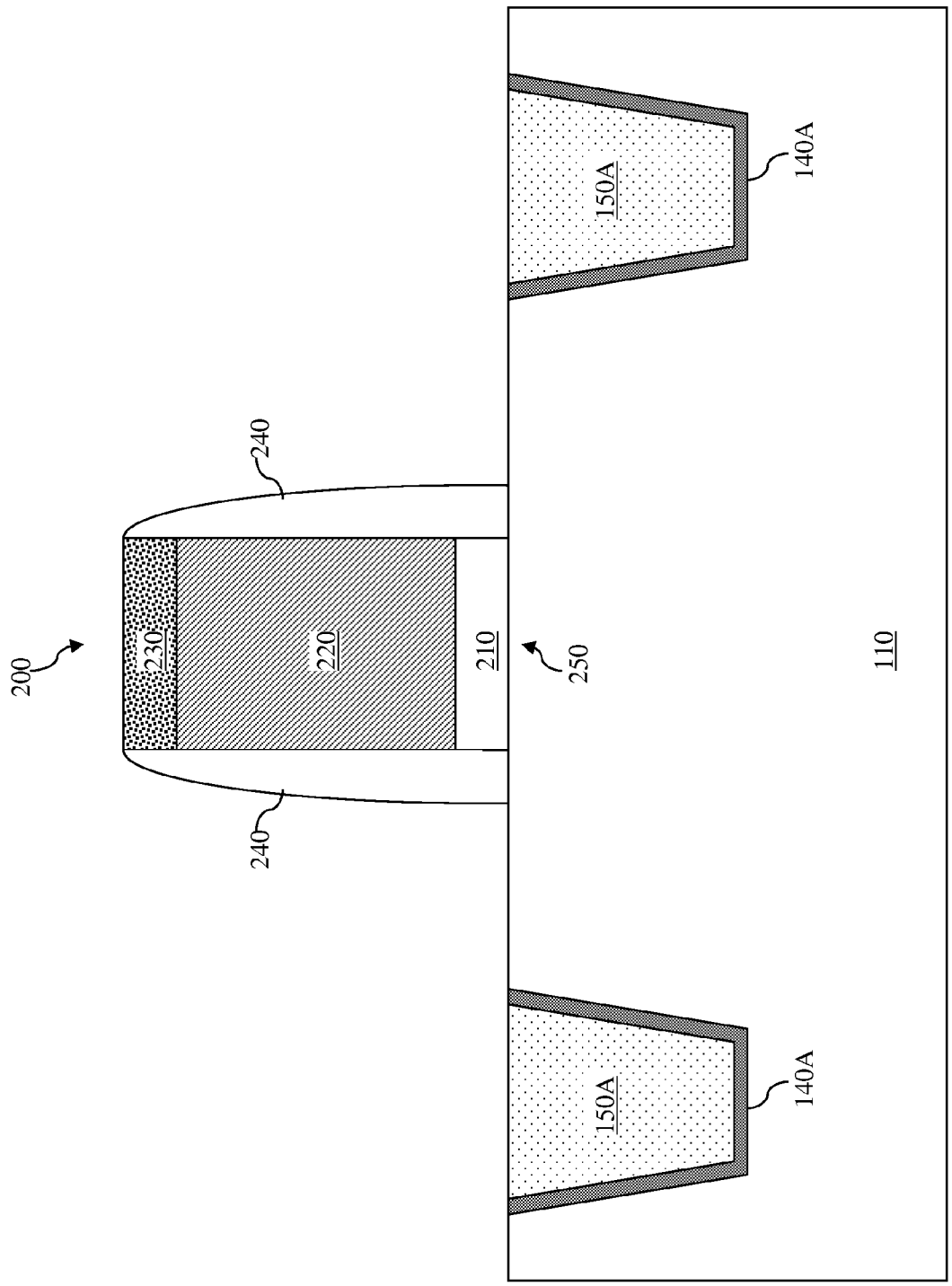

Referring now to FIG. 5, a gate structure 200 (also referred to as a gate stack) is formed over the substrate 110 and between the STI devices 150A. The gate structure 200 includes a gate dielectric component 210, a gate electrode component 220 disposed on the gate dielectric component 210, and a mask component 230 disposed on the gate electrode component 220. The gate structure 200 may be formed by forming a gate dielectric layer over the substrate 110, forming a gate electrode layer over the gate dielectric layer, and then patterning the gate electrode layer and the gate dielectric layer with the mask component 230. In some embodiments, the gate dielectric component 210 includes silicon oxide, the gate electrode component 220 includes polysilicon, and the mask component 230 includes a suitable dielectric hard mask. A region 250 of the substrate 110 underneath the gate structure 200 may be referred to as a channel region 250, since this is the region where a conductive channel will be formed when a transistor device (including the gate structure 200) is in operation.

Gate spacers 240 are also formed on the sidewalls of the gate structure 200. The gate spacers 240 are formed using a deposition process followed by an etching process (for example, an anisotropic etching process) known in the art. The gate spacers 240 contain a suitable dielectric material such as silicon nitride, silicon oxide, silicon carbide, silicon oxy-nitride, or combinations thereof. The gate spacers 240 may also be considered part of the gate structure 200 in some embodiments.

Figure 6:
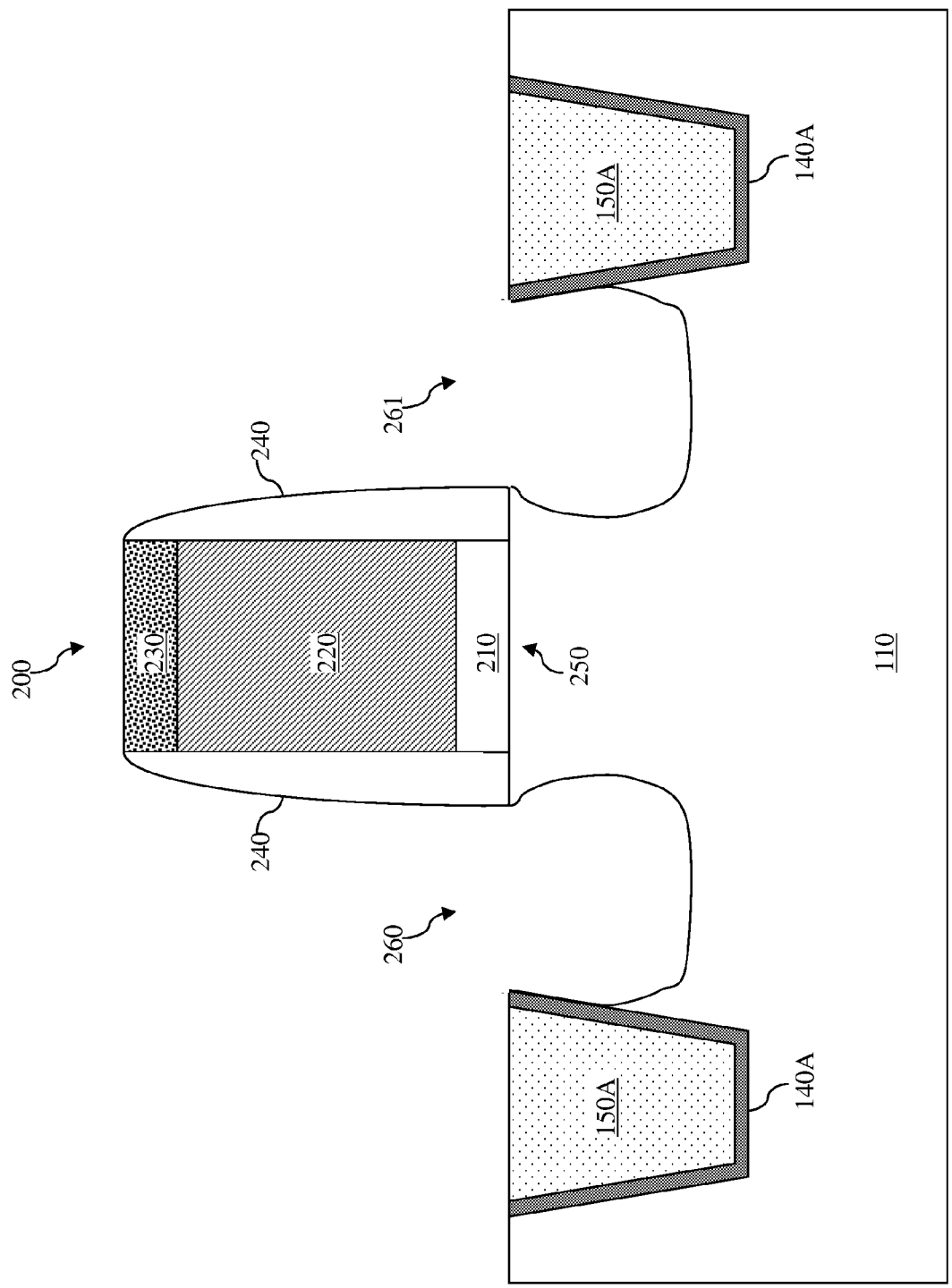

Referring now to FIG. 6, openings (or recesses) 260-261 in the substrate 110 are formed on opposite sides of the gate structure 200. The openings may be formed by one or more etching processes. For example, in some embodiments, a dry etching process may be performed to the substrate 110 while using the gate structure 200 (including the mask component 230 and the gate spacers 240) as a protective mask. In some embodiments, the etching process may use a HBr plasma gas as an etchant. A bias voltage of the plasma gas is tuned to achieve a desired profile for the etched recess region. Thereafter, a wet etching process may be performed to further expand the recesses inward underneath the gate structure 200. The wet etching process may use an acid as an etchant.

During either the dry etching process or the subsequent wet etching process, the etchants used will not substantially remove any of the liner layer 140A. In other words, the etching processes are tuned in a manner such that a high etching selectively exists between the material (e.g., III-V group compound) of the liner layer 140A and the material (e.g., silicon) of the substrate 110. Therefore, the removal of the substrate material during the etching processes will not significantly affect the liner layer material. It is understood that alternative etching processes may be performed to achieve a desired shape and profile for the openings 260-261 in other embodiments.

As illustrated in FIG. 6, the openings 260-261 directly abut the liner layer 140A. Alternatively, it may be said that portions of the outer surface of the liner layer 140A in effect constitute partial sidewalls of the openings 260-261. The depth of the openings 260-261 may vary from embodiment to embodiment.

Figure 7:
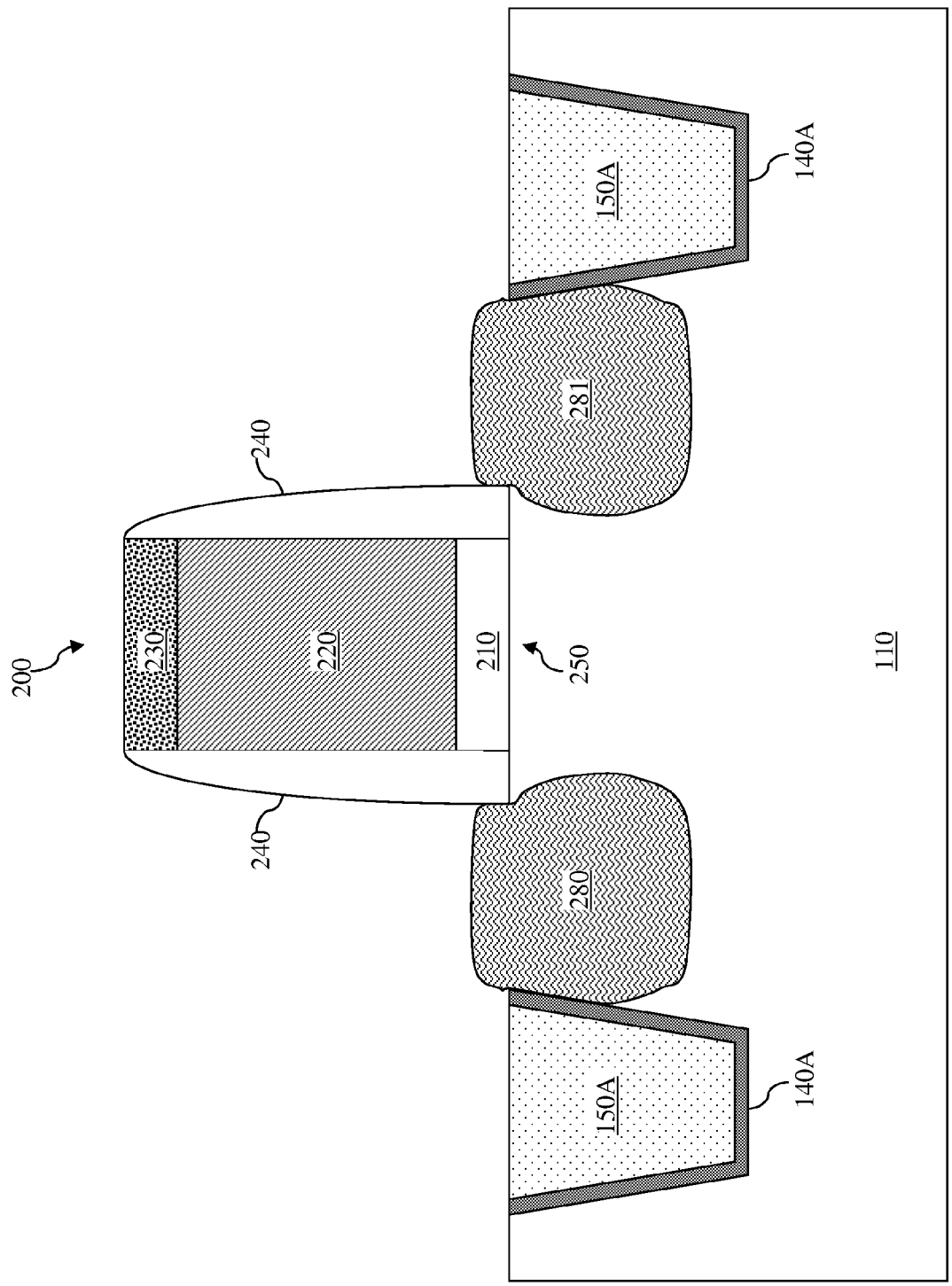

Referring now to FIG. 7, a semiconductor material is epi-grown in the openings 260-261. The semiconductor material may be grown through a selective epi-growth process (SEG) or other suitable epi-technology process. The SEG process may use a special CVD process. For example, the special CVD process may implement a low deposition rate or a low substrate temperature. Alternatively, ALD may be used for the SEG process. As a result of the SEG process, source/drain stressor components 280 and 281 are formed in the openings 260 and 261, respectively.

The source/drain stressor components 280-281 have different material compositions than the substrate 110. The different material composition may be chosen to create stress between the source/drain stressor components 280-281 and the substrate 210 so that carrier mobility of a channel region (under the gate structure 200) may be enhanced. Enhanced carrier mobility allows for a greater channel current without having to increase a gate voltage. The stress causes strain for the source/drain stressor components 280-281 and the substrate 110 disposed in between the source/drain stressor components. Thus, the source/drain stressor components 280-281 may be referred to as "strained" devices, and the interface between the substrate 110 and the source/drain stressor components 280-281 may be referred to as a "strained" interface.

The source/drain stressor components 280-281 may not be co-planar with the surface of the substrate 110. In fact, the source/drain stressor components 280-281 may be raised above the substrate 110 (as shown in FIG. 7) or below. In embodiments where the transistor device to be formed is a PMOS device, the source/drain stressor components 280-281 may include silicon germanium (SiGe). In embodiments where the transistor device to be formed is an NMOS device, the source/drain stressor components 280-281 may include silicon carbide (SiC).

For traditional fabrication processes, the liner layer 140A is not formed, and the STI devices would be in direct contact with the substrate material and therefore would constitute parts of the sidewalls of the recesses in which the source/drain stressor components are formed. However, it has been observed that the SEG process for forming the source/drain stressor components may not be capable of growing a semiconductor material on a dielectric material such as STI devices. Rather, the semiconductor material of the source/drain stressor components is typically epi-grown on a crystal surface. Consequently, in traditional processes, the source/drain stressor components may have a slanted surface. In such cases, it may also be said that the source/drain stressor components are standing on a free boundary (STI devices). When this occurs, the stress provided by the source/drain stressor components is substantially reduced, which is at least in part due to the reduction of the interface area between the STI device and the source/drain stressor components. The reduced stress leads to little (if any) carrier mobility enhancement in the channel region.

In comparison, according to the embodiments disclosed herein, the liner layer 140A is formed before the formation of the STI devices 140A. The liner layer 140A includes a crystal material suitable for epi-growing the semiconductor material (i.e., SiGe or SiC) of the source/drain stressor components 280-281. As such, when the source/drain stressor components 280-281 are formed, they are formed on the outer sidewalls of the liner layer 140A too, and they can be formed to fill the recesses 260-261. It may be said that according to the embodiments disclosed herein, the source/drain stressor components 280-281 are formed to stand on the crystal material of the liner layer 140A, rather than standing on a free boundary, or that the source/drain stressor components 280-281 are in direct physical contact with the liner layer 140A. Consequently, the STI devices 150A can effectively deliver stress to the source/drain stressor components 280-281, which may be transferred to the channel region 250 underneath the gate structure 200. Due to the stress, carrier mobility in the channel region 250 may be enhanced, thereby improving semiconductor device performance.

Figure 8:
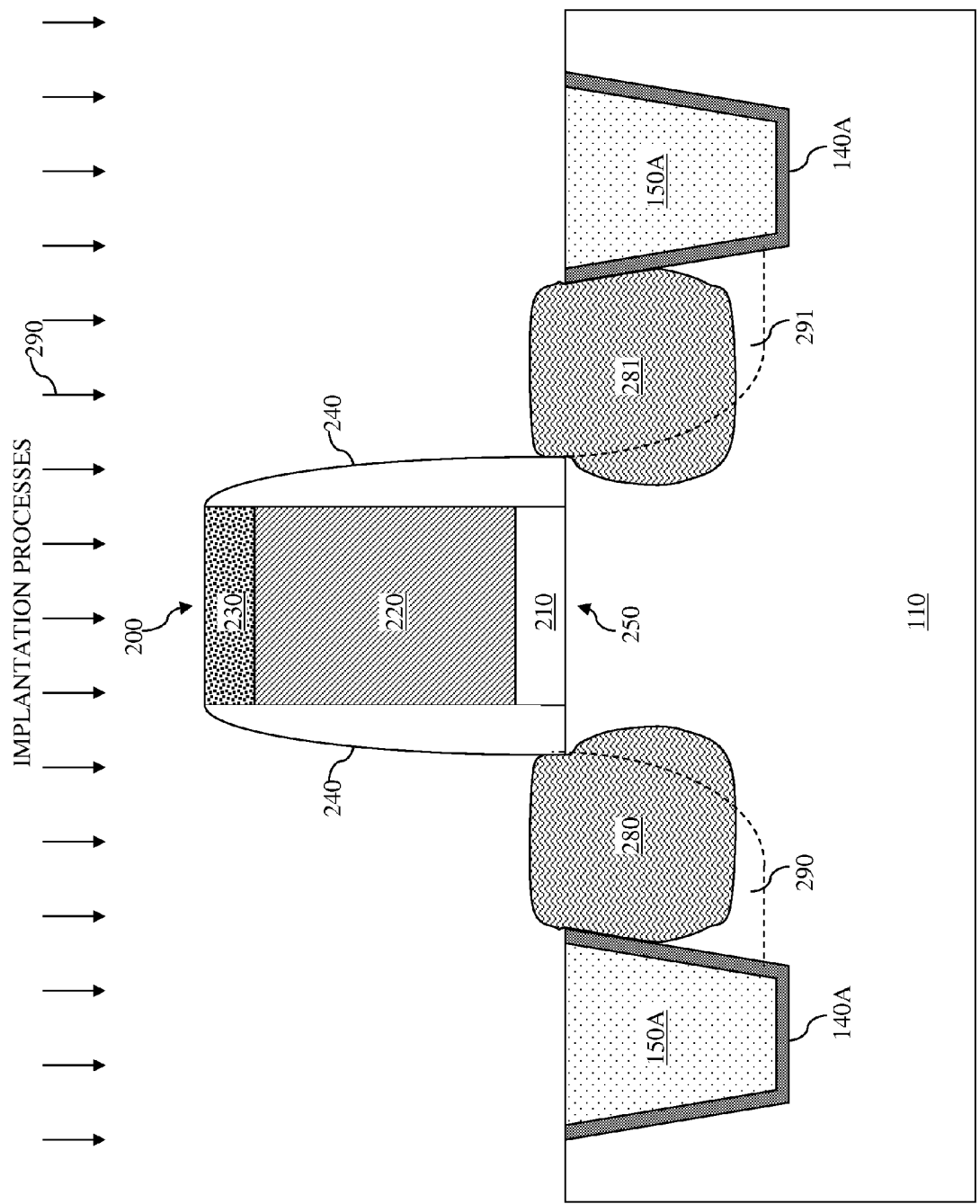

Referring now to FIG. 8, one or more implantation processes 290 may be performed to the substrate 110 to form source/drain regions 290-291. A plurality of p-type or n-type dopant ions may be implanted into the source/drain regions 290-291, depending on whether the transistor device is a PMOS device or an NMOS device. It is understood that the dopant ions may be implanted into regions of the substrate 110 outside the source/drain stressor components 280-281 and/or may not penetrate through the entire source/drain stressor components 280-281. In other words, the source/drain regions 290-291 of the transistor device may not necessarily coincide or align with the source/drain stressor components 280-281.

It is understood that in some embodiments, dummy gate structures may be formed on (above) the STI devices 150A. For the sake of simplicity, the dummy gate structures are not illustrated herein. Furthermore, the embodiments discussed above and illustrated in FIGS. 2-8 involve a "gate first" process. The concepts of the present disclosure may also apply to a "gate last" process or a "high-k last" process involving a high-k metal gate. The details of the "gate last" process and the "high-k last" process are briefly described below.

In a "gate last" process, a dummy (or replacement) gate structure is formed over the substrate. The dummy gate structure includes a high-k gate dielectric, for example a gate dielectric that contains hafnium oxide ($HfO_x$), or LaO, AlO, ZrO, TiO, $Ta_2O_5$, $Y_2O_3$, $SrTiO_3$ $BaTiO_3$, BaZrO, HfZrO, HfLaO, HfSiO, LaSiO, AlSiO, HfTaO, HfTiO, $Al_2O_3$, $Si_3N_4$, oxynitrides, etc. The dummy gate structure also includes a dummy polysilicon gate electrode formed over the high-k gate dielectric. After the formation of the source/drain regions, the dummy polysilicon gate electrode is removed, but the high-k gate dielectric is retained. A metal gate electrode is then formed in place of the dummy gate electrode and over the high-k gate dielectric. The metal gate electrode includes a work function metal, which may be N-type and includes Ti, Al, Ta, $ZrSi_2$, or TaN, or P-type and includes Mo, Ru, Ir, Pt, PtSi, MoN, or WNx. The work function metal has a respective range of work functions values associated therein. The work function metal tunes a work function of its respective transistor so that a desired threshold $V_t$ voltage is achieved. The metal gate electrode also includes a fill metal portion that serves as the main conductive portion of the gate electrode. The fill metal portions may include tungsten, aluminum, copper, or combinations thereof.

The "high-k last" process is similar to the "gate last" process in many aspects. However, in a "high-k last" process, the gate dielectric in the dummy gate structure is also a dummy gate dielectric. Stated differently, the high-k gate dielectric is not formed as a part of the dummy gate structure. Rather, a dummy gate dielectric (e.g., an oxide gate dielectric) is initially formed as a part of the dummy gate structure. After the formation of the source/drain regions, the dummy gate dielectric and the dummy gate electrode are replaced by the high-k gate dielectric and the metal gate electrode, respectively.

The high-k metal gate formed by the "gate last" or the "high-k last" processes may offer improved performance compared to polysilicon gates. For reasons of simplicity, the detailed process flows of the "gate last" and the "high-k last" processes are not illustrated herein, though it is understood that they may also benefit from various aspects of the present disclosure discussed above. Furthermore, it is understood that additional fabrication processes may be performed to complete the fabrication of the semiconductor device. For example, these additional fabrication processes may include forming an interconnect structure, packaging, and testing processes. For the sake of simplicity, these additional fabrication processes are not discussed in detail herein.

One of the broader forms of the present disclosure involves a semiconductor device. The semiconductor device includes: a gate structure located over a substrate; a source/drain component located besides the gate structure and at least partially in the substrate; and an isolation structure located in the substrate and adjacent the source/drain component; wherein: the isolation structure includes a dielectric portion that is at least partially surrounded by a liner layer; and the liner layer includes a crystal material.

In some embodiments, the liner layer is in physical contact with the source/drain component.

In some embodiments, the liner layer causes stress between the isolation structure and the source/drain component.

In some embodiments, the crystal material of the liner layer includes a semiconductor material different from a material of the substrate.

In some embodiments, the substrate contains silicon; and the crystal material contains one of: a III-V group compound and a II-VI group compound.

In some embodiments, the dielectric portion of the isolation structure includes a shallow trench isolation (STI).

In some embodiments, a material composition of the source/drain component is different from that of the substrate.

In some embodiments, the source/drain component includes one of: a silicon germanium material and a silicon carbide material.

Another one of the broader forms of the present disclosure involves a semiconductor device. The semiconductor device includes: a gate disposed over a semiconductor substrate; a trench liner coated along a recess in the substrate; a dielectric trench component disposed on the trench liner and filling the recess; and a source/drain stressor device disposed in the substrate and between the gate and the trench liner; wherein: the trench liner contains a semiconductor crystal material; and the trench liner directly abuts the source/drain stressor device.

In some embodiments, the semiconductor crystal material of the trench liner includes one of: a III-V family material and a II-VI family material.

In some embodiments, the trench liner delivers stress to the source/drain stressor device.

In some embodiments, the dielectric trench component is isolated from the semiconductor material of the substrate by the trench liner.

In some embodiments, the source/drain stressor device is substantially non-coplanar with a surface of the substrate.

In some embodiments, the source/drain stressor device contains one of: silicon germanium and silicon carbide.

Yet another one of the broader forms of the present disclosure involves a method of fabricating a semiconductor device. The method includes: forming a recess in a semiconductor substrate; forming a liner layer along the recess, the liner layer containing a semiconductor crystal material that is different from a material of the substrate; thereafter filling the recess with a dielectric material, the dielectric material being formed on the liner layer so as to be at least partially surrounded by the liner layer; and forming a source/drain component in the substrate, the source/drain component being in physical contact with the liner layer.

In some embodiments, the physical contact between the liner layer and the source/drain component causes stress to the source/drain component.

In some embodiments, the liner layer includes a material selected from the group consisting of: a III-V group compound, and a II-VI group compound.

In some embodiments, the forming the source/drain component includes: forming an opening in the substrate; and epi-growing one of: a silicon germanium material and a silicon carbide material in the opening.

In some embodiments, the forming opening includes performing one or more etching processes to the substrate in a manner such that the liner layer is substantially free of being etched during the one or more etching processes.

In some embodiments, the method of fabricating the semiconductor device further includes: before the forming the source/draining component, forming a gate structure over the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the embodiments disclosed herein may be implemented in a gate replacement process (or gate last process), or a hybrid process that includes a gate first process and gate last process.

What is claimed is:

1. A method of fabricating a semiconductor device, comprising:
    forming a first recess in a semiconductor substrate;
    forming a liner layer along the first recess, the liner layer containing a semiconductor crystal material that is different from a material of the substrate, wherein the semiconductor crystal material is a III-V group compound or a II-VI group compound;
    thereafter filling the first recess with a dielectric material, the dielectric material being formed on the liner layer so as to be at least partially surrounded by the liner layer; and
    forming a source/drain component in the substrate, the source/drain component being in physical contact with the liner layer, wherein the forming of the source/drain component includes:
        etching a second recess in the substrate, wherein the etching is performed using a high etching selectivity between the substrate and the III-V group compound of the liner layer or between the substrate and the II-VI group compound of the liner layer, so that the substrate is etched without substantially removing the liner layer; and
        growing the source/drain component in the second recess, wherein the etching the second recess and the growing are performed such that at a first segment of a side surface of the source/drain component is in direct contact with the liner layer, and a second segment of the side surface is separated from the liner layer by a portion of the semiconductor substrate.

2. The method of claim 1, wherein the physical contact between the liner layer and the source/drain component causes stress to the source/drain component.

3. The method of claim 1, wherein the forming the source/drain component includes:
    epi-growing one of: a silicon germanium material and a silicon carbide material in the second recess.

4. The method of claim 1, further including: before the forming the source/drain component, forming a gate structure over the substrate.

5. The method of claim 3, wherein the epi-growing is performed such that the silicon germanium material or the silicon carbide material is grown to protrude out of the substrate.

6. A method of fabricating a semiconductor device, comprising:

forming a first opening in a semiconductor substrate;

forming a liner layer over the semiconductor substrate, the liner layer containing a III-V group compound material or a II-VI group compound material, the liner layer partially filling the first opening;

filling the first opening with a dielectric material, the dielectric material being formed over the liner layer;

forming, after the filling the first opening, a second opening in the semiconductor substrate, the second opening being formed without substantially removing the liner layer;

performing a polishing process until the dielectric material, the liner layer, and the semiconductor substrate have co-planar upper surfaces; and forming a source/drain in the second opening;

wherein the forming the second opening and the forming the source/drain are performed such that at a first segment of a side surface of the source/drain is in direct contact with the liner layer, and a second segment of the side surface is separated from the liner layer by a portion of the semiconductor substrate.

7. The method of claim 6, wherein the forming the source/drain comprises forming the source/drain to be in physical contact with the liner layer such that stress is delivered to the source/drain due to the physical contact.

8. The method of claim 6, wherein the forming the source/drain includes epi-growing one of: a silicon germanium material and a silicon carbide material in the second opening.

9. The method of claim 8, wherein the epi-growing is performed such that the silicon germanium material or the silicon carbide material is grown to protrude out of the semiconductor substrate.

10. The method of claim 6, further comprising: before the forming the source/drain, forming a gate structure over the semiconductor substrate.

11. The method of claim 6, wherein the forming the gate structure comprises forming a high-k metal gate (HKMG) structure.

12. The method of claim 6, wherein the filling the first opening comprises completely filling the first opening with the dielectric material, and further comprising polishing the dielectric material to form a shallow trench isolation (STI) in the first opening.

13. The method of claim 6, wherein the forming the source/drain comprises forming a source/drain having a different material composition than the semiconductor substrate.

14. The method of claim 6, wherein the source/drain is formed to be completely isolated from the dielectric material filling the first opening in a cross-sectional side view.

15. The method of claim 6, wherein the source/drain is formed to directly abut a portion of the liner layer that is formed on a sidewall of the first opening.

16. A method of fabricating a semiconductor device, comprising:

forming a trench in a semiconductor substrate;

forming a liner layer containing a III-V group compound material or a II-VI group compound material over the substrate, the liner layer partially filling the trench;

forming a shallow trench isolation (STI) by filling the first opening with a dielectric material and polishing the dielectric material, the STI being partially surrounded by the liner layer;

thereafter etching a recess in the semiconductor substrate using a high etching selectivity between the semiconductor substrate and the III-V group compound material of the liner layer or between the semiconductor substrate and the II-VI group compound material of the liner layer, so that the semiconductor substrate is etched without substantially etching the liner layer; and growing a source/drain in the recess such that the source/drain is in direct physical contact with the liner layer and separated from the STI, the source/drain and the semiconductor substrate having different material compositions;

wherein the etching the recess and the growing are performed such that at a first segment of a side surface of the source/drain is in direct contact with the liner layer, and a second segment of the side surface is separated from the liner layer by a portion of the semiconductor substrate.

17. The method of claim 16, wherein the growing of the source/drain comprises growing silicon germanium or silicon carbide in the recess via an epitaxial growth process.

18. The method of claim 16, wherein the growing of the source/drain is performed such that the source/drain is grown to protrude out of the semiconductor substrate.

19. The method of claim 16, further comprising: before the growing of the source/drain, forming a gate structure over the semiconductor substrate.

20. The method of claim 19, wherein the forming the gate structure comprises forming a high-k metal gate (HKMG) structure.

* * * * *